(12) United States Patent
Pala et al.

(10) Patent No.: US 7,562,993 B2
(45) Date of Patent: Jul. 21, 2009

(54) CONTINUOUS LED INSTRUMENT PANEL

(75) Inventors: Silviu Pala, Birmingham, MI (US); Christopher Arms, Farmington Hills, MI (US)

(73) Assignee: DENSO International America, Inc., Douthfield, MI (US)

( * ) Notice: Subject to any disclaimer, the term of this patent is extended or adjusted under 35 U.S.C. 154(b) by 282 days.

(21) Appl. No.: 11/201,078

(22) Filed: Aug. 10, 2005

(65) Prior Publication Data

US 2007/0035959 A1 Feb. 15, 2007

(51) Int. Cl.
*G01D 11/28* (2006.01)
*B60Q 1/00* (2006.01)
*B60Q 1/26* (2006.01)

(52) U.S. Cl. .......................... 362/23; 362/28; 362/489

(58) Field of Classification Search ................... 362/23, 362/28, 29, 34, 471, 487, 488, 489, 800; 177/177; 166/250, 521, 253, 256, 257

See application file for complete search history.

(56) References Cited

U.S. PATENT DOCUMENTS

| | | | | |
|---|---|---|---|---|
| 5,130,548 A | * | 7/1992 | Sano et al. | 250/461.1 |
| 5,741,058 A | * | 4/1998 | Suzuki et al. | 362/27 |
| 6,491,412 B1 | * | 12/2002 | Bowman et al. | 362/249 |
| 2006/0039129 A1 | * | 2/2006 | Coghlan et al. | 362/23 |
| 2006/0044778 A1 | * | 3/2006 | Muramatsu | 362/23 |

* cited by examiner

*Primary Examiner*—Jacob Y Choi
(74) *Attorney, Agent, or Firm*—Harness, Dickey & Pierce, PLC

(57) ABSTRACT

A viewed component of a vehicle instrument cluster includes a dial structure. A printed circuit board is arranged on the dial structure and has an outboard surface. A layer of printed ink is arranged on the outboard surface of the printed circuit board. A series of LEDs are arranged on the outboard surface of the printed circuit board wherein the series of LEDs occupy an outermost layer of the dial structure.

18 Claims, 4 Drawing Sheets

_US 7,562,993 B2_

CONTINUOUS LED INSTRUMENT PANEL

FIELD OF THE INVENTION

The present invention relates to instrument panel gauges in vehicles and more particularly to an instrument panel gauge having surface mounted light emitting diodes on an outer face.

BACKGROUND OF THE INVENTION

Instrument clusters on automobiles generally include a plurality of gauges for displaying such operational information such as vehicle speed, engine RPM, engine temperature, fuel level and many other information. The gauges may include analog or digital readings for displaying the information depending on manufacturer and styling preferences. An analog gauge typically includes a faceplate having indicia thereon such as numbers and a pointer for rotating to the appropriate number.

One important design consideration for an instrument cluster and related gauges is the ability of a vehicle operator to easily view and read the gauges in all driving environments. In particular, nighttime driving requires the instrument cluster to illuminate in some fashion whereby the numbers and corresponding pointers are easily distinguishable.

In one example, light emitting diodes (LEDs) have been used to backlight a gauge or accent a telltale or other icon on the instrument cluster. Typically, such LEDs are mounted inboard of a gauge face and are used in conjunction with a chimney structure mounted between the gauge face and the LED. As a result, the chimney is adapted to disperse the light outward from a face of the gauge. However, the use of inboard mounted LEDs and related chimneys may compromise packaging and limit the amount of LEDs that may be used on the gauge.

SUMMARY OF THE INVENTION

A viewed component of a vehicle instrument cluster includes a dial structure. A printed circuit board is arranged on the dial structure and has an outboard surface. A layer of printed ink is arranged on the outboard surface of the printed circuit board. A series of LEDs are arranged on the outboard surface of the printed circuit board wherein the series of LEDs occupy an outermost layer of the dial structure.

In one example, the layer of printed ink defines a series of indicia on the outboard face. The layer of printed ink further defines a plurality of gradations on the outboard face.

According to other features, the viewed component further comprises an electroluminescent lamp arranged inboard of the printed circuit board.

According to still additional features, an insulating material is arranged outboard of the printed circuit board. The series of LEDs are electrically connected to the printed circuit board through vias extending through the insulating material.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
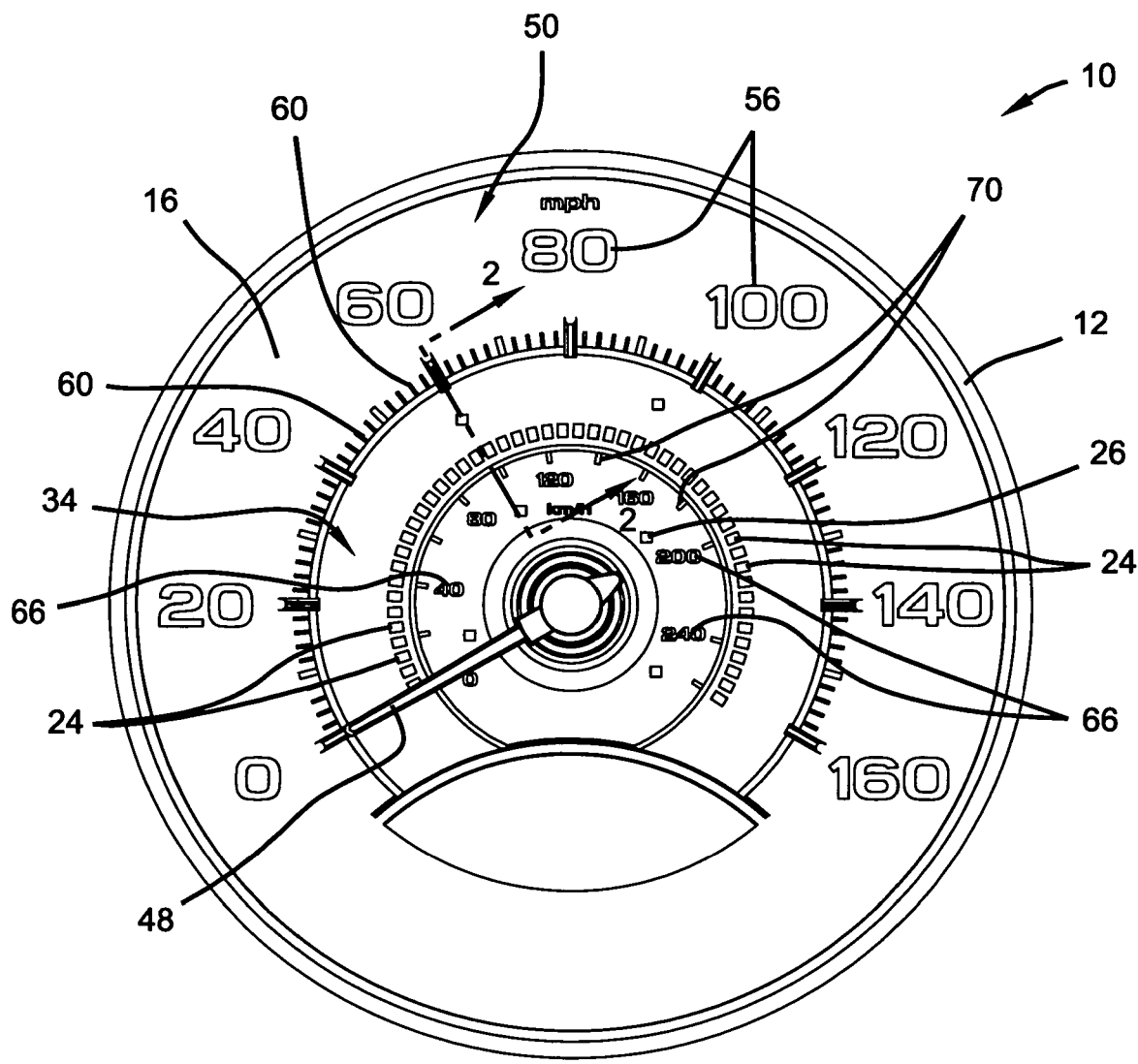
FIG. 1 is a front illustration of a viewed component constructed in accordance with the present teachings.

With initial reference to FIG. 1, a viewed component constructed in accordance to the present teachings is shown and identified generally at reference 10. The viewed component 10 is illustrated as a speedometer. It is appreciated that the viewed component may alternatively comprise other gauges, dials or instruments such as, but not limited to a tachometer, a fuel gauge, a temperature gauge and an oil pressure gauge for example.

Figure 2:
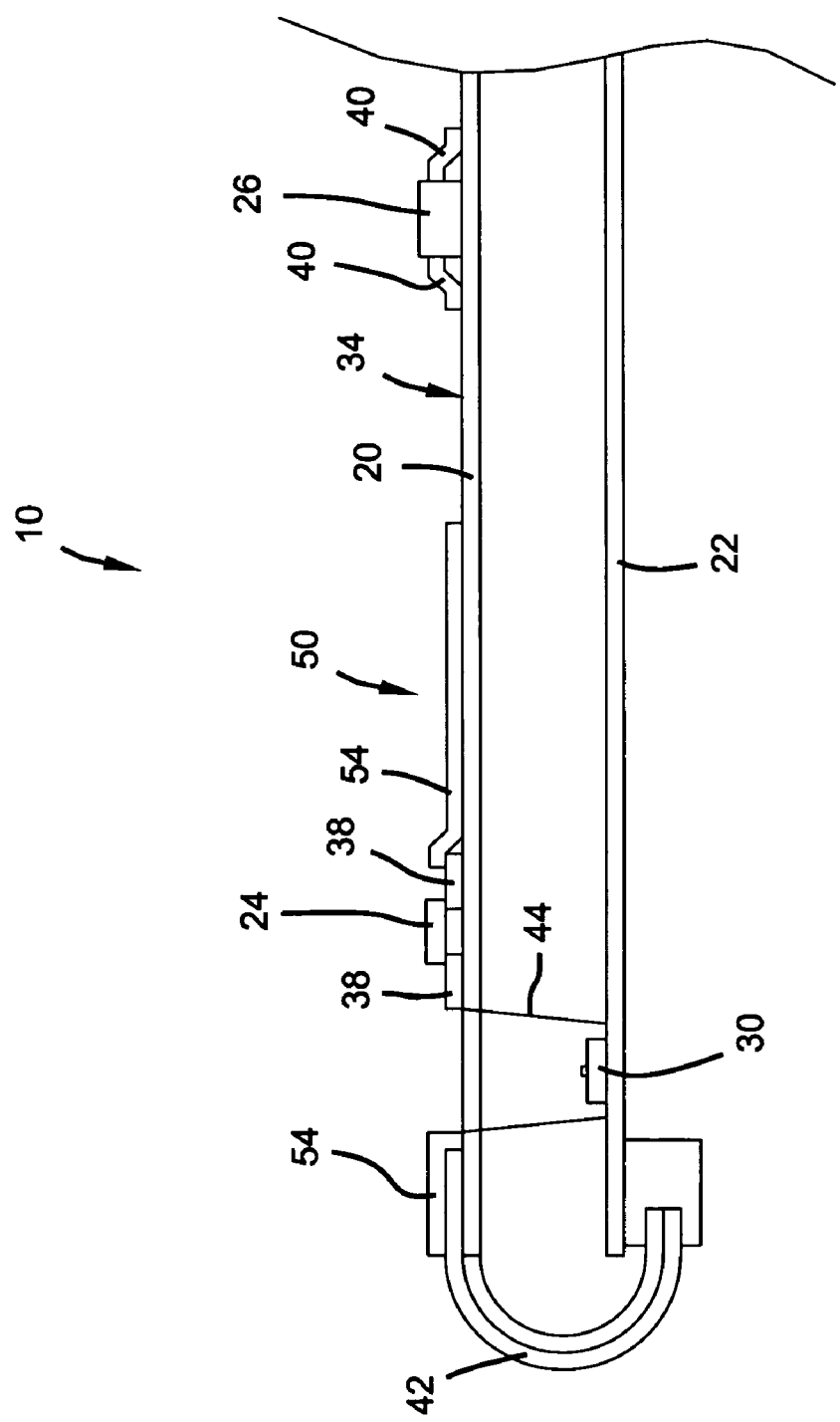
FIG. 2 is a partial sectional view along line 2-2 of FIG. 1.

With reference now to FIGS. 1 and 2, the viewed component 10 generally includes a housing 12, a dial 16, an outboard printed circuit board 20, an inboard printed circuit board 22, a first series of light emitting diodes (LEDs) 24, a second series of LEDs 26 and a third series of LEDs 30. The first and second series of LEDs 24 and 26 are surface mounted on an outboard surface 34 of the outboard printed circuit board 20. Conductive traces 38 and 40 connect the respective first and second series of LEDs 24 and 26 to the outboard printed circuit board 20. An electrical connector 42 extends between the outboard and inboard printed circuit board 20 and 22.

The third series of LEDs 30 are arranged on the inboard printed circuit board 22. A chimney 44 is arranged between the outboard and inboard printed circuit board 20 and 22 to direct light from the third series of LEDs 30 outward. A pointer 48 is centrally mounted for rotatable movement within the viewed component 10. As will be described in greater detail, the first and second series of LEDs 24 and 26 are surface mounted on the outboard printed circuit board 20 for enhanced resolution. In addition, by surface mounting the first series of LEDs 24, they may be placed closer together as compared to the third series of LEDs 30 that incorporate the chimney arrangement and require increased packaging space.

The dial 16 defines a face 50 on the outboard surface 34 of the outboard printed circuit board 20. The face 50 includes a layer of printed ink 54. The layer of printed ink 54 defines a first series of indicia 56 (FIG. 1) thereon. While represented as numerical English units (MPH), the first series of indicia 56 may alternatively comprise other markers including Metric units, such as Km/h for example. In addition, the layer of printed ink 54 further defines a first series of gradations 60 arranged radially around the face 50 of the dial 16. The printed ink 54 also defines a second series of indicia 66 arranged inboard of the first series of indicia 56. While represented as Metric units (Km/h), the second series of indicia 66 may alternatively comprise other markers including English units such as MPH for example.

A second series of gradations 70 are aligned to correspond with the second series of indicia 66. It is appreciated that the layout and content of the printed ink 54 is merely exemplary and that other arrangements may be used on the face 50 of the dial 16 according to design requirements. The first series of LEDs 24 may be additionally or alternatively located radially outboard of the pointer 48 such as adjacent to the first series of indicia 56. Other locations are contemplated. Likewise, the second and third series of LEDs 26 and 30 may be configured to align with other printed identifiers on the dial 16 such as tell tales for example.

Figure 3:
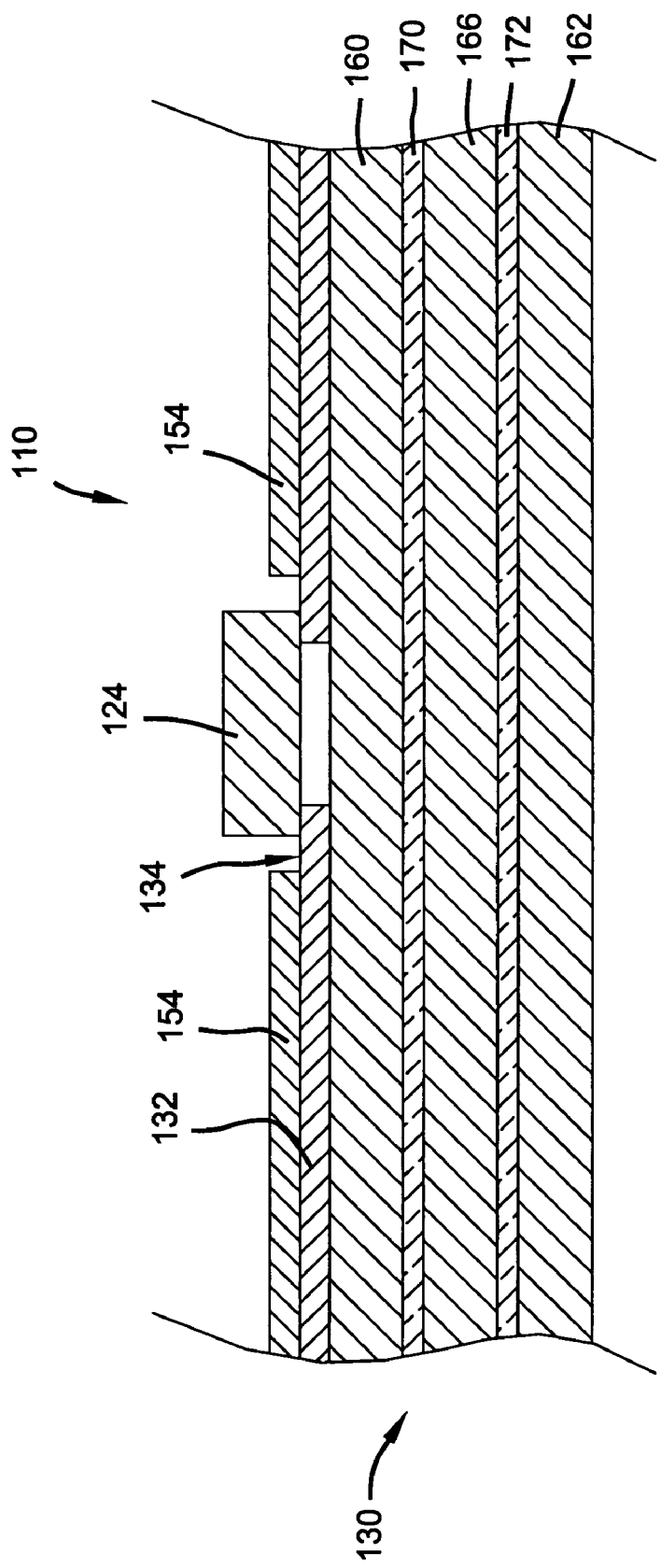
FIG. 3 is a partial sectional view through a surface mounted LED of FIG. 1 according to another embodiment.

With reference now to FIG. 3, a sectional view of a viewed component 110 according to an additional embodiment is shown. The viewed component 110 incorporates a series of surface mounted LEDs 124 similar to the first series of LEDs 24 described in relation to the viewed component 10. The viewed component 110 incorporates an electroluminescent (EL) lamp 130 inboard of a conductive trace 132 defining an outboard face 134. In one form, the conductive trace 132 may be a printed circuit board. The conductive trace 132 may be semi-transparent or opaque such that the light emitted from the EL lamp 130 may pass outwardly therethrough. As shown, an LED 124 is electrically connected to the conductive trace 132. A layer of printed ink 154 may be arranged across the face 134 of the conductive trace 132. The printed ink 154 may define indicia, gradations or other markings as desired. Of note, the LED 124 defines an outboard plane on the viewed component 110.

In one exemplary construction, the EL lamp 130 may comprise an outboard electrode 160 and an inboard electrode 162 sandwiching an electroluminescent material 166. One exemplary material for the inboard and outboard electrodes 160 and 162 may be barium titanate. The electroluminescent material 166 may comprise phosphor, for example. A layer of transparent conductive material 170 and 172 is arranged on opposite sides of the electroluminescent material 166. In one form, the transparent conductive material 170 and 172 may comprise Indium Tin Oxide (ITO). It is appreciated that the configuration and materials of the EL lamp 130 are merely exemplary and other configurations may be employed.

Figure 4:
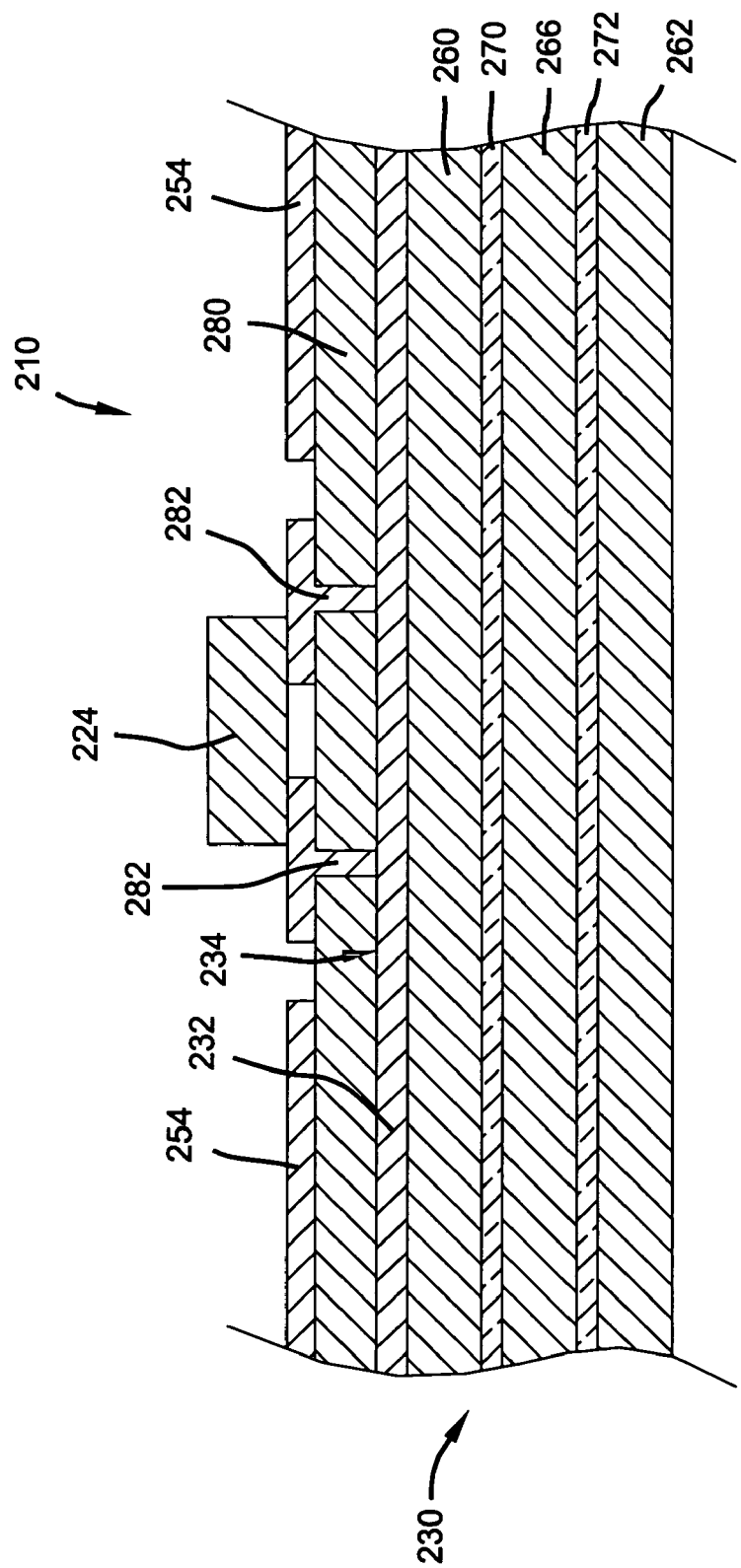
FIG. 4 is a partial sectional view through a surface mounted LED of FIG. 1 according to still another embodiment.

Turning now to FIG. 4, a sectional view of a viewed component 210 according to an additional embodiment is shown. The viewed component 210 incorporates an electroluminescent (EL) lamp 230 inboard of a conductive trace 232 defining an outboard face 234 similar to the viewed component 110 illustrated in FIG. 3. In one form, the conductive trace 232 may be a printed circuit board. The conductive trace 232 may be semi-transparent or opaque such that the light emitted from the EL lamp 230 may pass outwardly therethrough. A semi-transparent insulator 280 is arranged outboard of the conductive trace 232. The semi-transparent insulator 280 provides increased protection and therefore durability to the EL lamp 230. As shown, an LED 224 is electrically connected to the conductive trace 232 by way of vias 282. The vias 282 each comprise electrically conducive material that extend through passages in the semi-transparent insulator 280. A layer of printed ink 254 may be arranged across the insulator 280. The printed ink 254 may define indicia, gradations or other markings as desired. Of note, the LED 224 defines an outboard plane on the viewed component 210.

Returning now to FIG. 1, the surface mounted arrangement of the first series of LEDs 24 allows a large number of LEDs 24 to be located adjacent each other. Of note, the first series of LEDs 24 occupy on outermost layer of the dial 16. In one example, the first series of LEDs 24 may be configured to illuminate in a pattern corresponding to the travel of the pointer 48. For example, if the pointer 48 is rotated to point to 40 MPH, each LED 24 of the first series located at 40 MPH and at MPH locations below 40 MPH would be illuminated. As a result, the corresponding LEDs 24 create a three-dimensional radial line for the operator to view. It is contemplated that the first series of LEDs 24 may be located elsewhere on the dial 16 and/or configured to illuminate differently. For example, the first series of LEDs 24 may be located proximate the first series of indicia 60. In another example, the first series of LEDs 24 may be configured to illuminate only at the corresponding pointer location.

Those skilled in the art can now appreciate from the foregoing description that the broad teachings of the present invention can be implemented in a variety of forms. For example, as noted, "EL" stands for electroluminescent. As such, the light source may be a surface mounted device such as an LED, a deposited (printed) polymer encapsulated electro-luminescent device or other device. Therefore, while this invention has been described in connection with particular examples thereof, the true scope of the invention should not be so limited since other modifications will become apparent to the skilled practitioner upon a study of the drawings, the specification and the following claims.

What is claimed is:

1. A viewed component of a vehicle instrument cluster comprising:
a dial structure;
a printed circuit board arranged on the dial structure and defining an outboard surface;
a layer of printed ink arranged on said outboard surface of said printed circuit board, wherein said layer of printed ink defines a series of indicia on said outboard face, said series of indicia corresponding to a pointer position; and
a series of physically viewable LEDs arranged above the printed ink layer and projecting from said outboard surface and toward a viewer, wherein said series of LEDs are configured to project initially in a direction out of said instrument cluster and at a height equal to or higher than said layer of printed ink, said series of LEDs also corresponding to said pointer position.

2. The viewed component of claim 1 wherein said layer of printed ink defines a series of indicia on said outboard face, said series of indicia corresponding to a scale of increasing units of measure.

3. The viewed component of claim 2 wherein said layer of printed ink further defines a plurality of gradations on said outboard face.

4. The viewed component of claim 2 wherein said series of LED's are substantially aligned with said series of indicia and configured to illuminate in a pattern corresponding to a determined unit of measure.

5. The viewed component of claim 4, further comprising a pointer rotatably mounted on said dial structure, wherein LED's of said series of LED's are aligned with indicia of said series of indicia and have a value corresponding to said determined unit of measure and are illuminable.

6. The viewed component of claim 1, further comprising an electroluminescent lamp arranged inboard of said printed circuit board, wherein said electroluminescent lamp projects outward of said instrument cluster.

7. The viewed component of claim 6, further comprising an insulating material arranged outboard of said printed circuit board to provide increased protection to said electroluminescent lamp.

8. The viewed component of claim 7 wherein said series of LEDs are electrically connected to said printed circuit board through vias extending through said insulating material.

9. The viewed component of claim 8 wherein said series of LED's are substantially aligned with said indicia and configured to illuminate in a pattern corresponding to a determined unit of measure.

10. The viewed component of claim 9, further comprising a pointer rotatably mounted on said dial structure, wherein said pointer rotates to said determined unit of measure wherein LED's of said series of LED's are aligned with indicia of said series of indicia and have a value corresponding to said determined unit of measure and are illuminable.

11. A viewed component of a vehicle instrument cluster comprising:
   a dial structure;
   a printed circuit board arranged on the dial structure and having an outboard surface;
   a layer of printed ink arranged on said outboard surface of said printed circuit board, wherein said layer of printed ink defines a series of indicia on said outboard face, said series of indicia corresponding to a scale of increasing units of measure; and
   a series of LEDs arranged on said outboard surface of said printed circuit board wherein said series of LEDs occupy an outermost surface of said dial structure and project light outward from said instrument cluster said series of LEDs protruding toward a viewer at a height equal to or higher than said layer of printed ink, said series of LEDs also corresponding to said scale of increasing units of measure.

12. The viewed component of claim 11 wherein said layer of printed ink further defines a plurality of gradations on said outboard face.

13. The viewed component of claim 11, further comprising an electroluminescent lamp arranged inboard of said printed circuit board, wherein said electroluminescent lamp projects outward of said instrument cluster.

14. The viewed component of claim 13, further comprising an insulating material arranged outboard said printed circuit board to provide increased protection to said electroluminescent lamp.

15. The viewed component of claim 14 wherein said series of LEDs are electrically connected to said printed circuit board through vias extending through said insulating material.

16. A viewed component of a vehicle instrument cluster comprising:
   a dial structure;
   a first printed circuit board arranged on the dial structure and having an outboard surface;
   a layer of printed ink arranged on said outboard surface of said printed circuit board;
   a first series of LEDs arranged on said outboard surface of said printed circuit board wherein said first series of LEDs physically protrude from said outboard surface and toward a viewer, occupy an outermost surface of said dial structure, directly project light outward from said instrument cluster, and have a height equal to or higher than said layer of printed ink;
   a second printed circuit board arranged on the dial structure and offset inboard farther than said first printed circuit board from a viewer, relative to said first printed circuit board; and
   a second series of LEDs arranged on said second printed circuit board, said second series of LEDs protruding away from said second printed circuit board and toward a viewer.

17. The viewed component of claim 16 wherein said layer of printed ink defines a series of indicia on said outboard surface, said series of indicia corresponding to a scale of increasing units of measure and wherein said first series of LED's are substantially aligned and correspond with said indicia and are configured to illuminate in a pattern corresponding to a determined unit of measure.

18. The viewed component of claim 17, further comprising a pointer rotatably mounted on said dial structure, wherein said pointer rotates around said dial to said determined unit of measure wherein LED's of said series of LED's are aligned with indicia of said series of indicia and have a value corresponding to said determined unit of measure and are illuminable.

* * * * *